United States Patent
Cho et al.

(10) Patent No.: US 11,776,987 B2
(45) Date of Patent: Oct. 3, 2023

(54) LED DISPLAY APPARATUS HAVING MICRO LED MODULE

(71) Applicant: SEOUL VIOSYS CO., LTD., Gyeonggi-do (KR)

(72) Inventors: Dae Sung Cho, Gyeonggi-do (KR); So Ra Lee, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 181 days.

(21) Appl. No.: 17/152,290

(22) Filed: Jan. 19, 2021

(65) Prior Publication Data

US 2021/0225929 A1    Jul. 22, 2021

Related U.S. Application Data

(60) Provisional application No. 63/026,490, filed on May 18, 2020, provisional application No. 62/963,776, filed on Jan. 21, 2020.

(51) Int. Cl.
*H01L 27/15* (2006.01)
*H01L 33/62* (2010.01)
*H01L 33/48* (2010.01)

(52) U.S. Cl.
CPC .......... *H01L 27/156* (2013.01); *H01L 33/486* (2013.01); *H01L 33/62* (2013.01)

(58) Field of Classification Search
CPC combination set(s) only.
See application file for complete search history.

(56) References Cited

U.S. PATENT DOCUMENTS

| 9,935,153 | B1 | 4/2018 | Jung et al. | |
| 2005/0133906 | A1* | 6/2005 | Woodall | H05K 1/0204 |
| | | | | 257/E23.105 |
| 2008/0157318 | A1* | 7/2008 | Chow | H01L 23/552 |
| | | | | 257/E23.169 |
| 2009/0166833 | A1* | 7/2009 | Webster | H01L 25/50 |
| | | | | 257/E23.18 |
| 2020/0163233 | A1* | 5/2020 | Brackley | G02F 1/13336 |

FOREIGN PATENT DOCUMENTS

| JP | 05042718 A | 2/1993 |
| KR | 100783480 B1 | 12/2007 |
| KR | 1020120125325 A | 11/2012 |

(Continued)

OTHER PUBLICATIONS

International Search Report for corresponding International Application No. PCT/KR2021/000848, dated May 6, 2021, English Translation, 5 pages.

(Continued)

*Primary Examiner* — Ratisha Mehta
(74) *Attorney, Agent, or Firm* — LaBatt, LLC

(57) ABSTRACT

A display apparatus includes a display substrate, first micro LED modules arranged on the display substrate, and at least one second micro LED module disposed between the first micro LED modules. Each of the first micro LED modules includes a first substrate and micro LEDs disposed on the first substrate. The second micro LED module includes a second substrate and micro LEDs disposed on the second substrate. The second substrate bridges two adjacent first substrates.

20 Claims, 10 Drawing Sheets

(56) References Cited

FOREIGN PATENT DOCUMENTS

| KR | 1020180075827 A | 7/2018 |
|---|---|---|
| KR | 1020180118488 A | 10/2018 |
| KR | 1020190008746 A | 1/2019 |
| KR | 1020190039313 A | 4/2019 |
| KR | 1020190109222 A | 9/2019 |
| KR | 1020190119438 A | 10/2019 |
| WO | 2017150910 A1 | 9/2017 |
| WO | 2019014036 A1 | 1/2019 |

OTHER PUBLICATIONS

International Search Report for International Application No. PCT/KR2021/000779, dated Apr. 12, 2021, English Translation, 2 pages.
International Search Report for corresponding International Application No. PCT/KR2021/000827, dated Apr. 20, 2021, English Translation, 2 pages.

\* cited by examiner

RELATED ART

RELATED ART

LED DISPLAY APPARATUS HAVING MICRO LED MODULE

CROSS-REFERENCE OF RELATED APPLICATIONS AND PRIORITY

The present application is a Non-provisional Application which claims priority to the benefit of U.S. Provisional Application Nos. 62/963,776 filed Jan. 21, 2020 and 63/026,490 filed May 18, 2020, the disclosures of which are incorporated by reference their entirety.

TECHNICAL FIELD

The present disclosure relates to an LED display apparatus, and more particularly, to an LED display apparatus having tile-shaped micro LED modules.

BACKGROUND

As an inorganic light source, light emitting diodes are for use in various fields including displays, vehicular lamps, general lighting, and the like. With various advantages such as long lifespan, low power consumption, and rapid response, light emitting diodes have been replacing existing light sources.

For example, a display apparatus realizes various colors through mixture of blue, green and red light. In order to realize various images, the display apparatus includes a plurality of pixels, each of which has subpixels corresponding to blue, green and red light, respectively. A color of a certain pixel is determined based on the colors of the sub-pixels so that images can be realized through combination of such pixels.

Light emitting diodes have been used as backlight light sources in display apparatuses. However, LED displays may directly realize images using the light emitting diodes.

As LEDs can emit various colors depending upon materials thereof, it is possible to provide a display apparatus by arranging individual LED chips emitting blue, green and red light on a two-dimensional plane. However, when one LED chip is arranged in each sub-pixel, the number of LED chips may be increased, which may result in a longer time for a mounting process during manufacture. Accordingly, stacked light emitting devices may reduce the time required for the mounting process. For example, by manufacturing a light emitting device in which a red LED, a blue LED, and a green LED are stacked, red, blue, and green light may be implemented using one light emitting device. Accordingly, one pixel that emits red, blue, and green light may be provided with a single light emitting device, thereby reducing the number of light emitting devices mounted on the display apparatus.

FIG. 1 is a plan view illustrating an LED display apparatus 10 according to the related art. Referring to FIG. 1, the display apparatus 10 includes a display substrate 11 and light emitting devices R, G, and B. Each of the light emitting devices R, G, and B is a micro LED, which has a form factor of about 10000 μm² or less, which is available in the art.

Each of red, green, and blue light emitting devices R, G, and B is a sub-pixel, and sub-pixels constitute one pixel P. A plurality of pixels P is arranged on the display substrate 11 and an image is implemented with these pixels P. The display substrate 11 is a substrate corresponding to an entire screen of the display apparatus, and in some embodiments, millions to tens of millions of micro LEDs are mounted on the display substrate 11.

However, due to the small form factor of micro LEDs, it is difficult to handle micro LEDs, and thus, it is not easy to transfer and mount millions to tens of millions of micro LEDs on a display panel. Moreover, the micro LEDs may be damaged by an external impact, and thus, defects may be formed in the micro LEDs during transportation.

Accordingly, when all of the micro LEDs are mounted on the display substrate 11 corresponding to one screen, a manufacturing yield of the display apparatus may not be favorable. Moreover, since a large number of light emitting devices R, G, and B have to be mounted on the large-area display substrate 11, workability is poor.

These drawbacks may occur for a pixel configured to be using a stacked light emitting device. To solve these drawbacks, a tile-shaped micro LED module may be used.

FIG. 2 is a plan view illustrating a display apparatus 20 including micro LED modules according to the related art, and FIG. 3 is a schematic partial cross-sectional view taken along line A-A' of FIG. 2.

Referring to FIG. 2, the display apparatus 20 includes a display substrate 21 and tile-shaped micro LED modules T. The micro LED modules T include light emitting devices R, G, and B, and are arranged on the display substrate 21.

The micro LED module T may include a plurality of pixels, and these modules T may be mounted on the display substrate 21 to form an entire screen. Accordingly, instead of mounting all of the light emitting devices R, G, and B on the display substrate 21, the light emitting devices R, G, and B may be mounted on a plurality of micro LED modules T, and the display apparatus 20 may be provided by mounting the LED modules T on the display substrate 21.

As the display apparatus 20 may be manufactured by selecting favorable LED modules T, a manufacturing yield of the display apparatus 20 may be improved, and workability may also be improved.

However, when the display apparatus 20 is manufactured by tiling the plurality of micro LED modules T, the micro LED modules T are spaced apart from one another in consideration of tolerance generated when the micro LED modules T are manufactured and mounted, as indicated by a dotted line in FIG. 3.

As the micro LED modules T are spaced apart, a space between them may appear on the screen as, for example, a linear defect. This linear defect can be observed not only in an idle state in which an image is not displayed, but also when an image is displayed.

SUMMARY

Exemplary embodiments provide a display apparatus capable of reducing linear defects observed when micro LED modules are arranged using a tiling technique.

The exemplary embodiments also provide a micro LED module of a novel structure.

An exemplary embodiment provides a display apparatus including a display substrate, first micro LED modules arranged on the display substrate, and at least one second micro LED module disposed between the first micro LED modules. Each of the first micro LED modules includes a first substrate, and micro LEDs disposed on the first substrate. The second micro LED module includes a second substrate, and micro LEDs disposed on the second substrate. The second substrate bridges two adjacent first substrates.

An exemplary embodiment provides a micro LED module including a center body, a top plate located over the center body, and micro LEDs disposed on the top plate. The top plate has a wider width than that of the center body in one direction, and at least one of the micro LEDs is disposed outside of an upper region of the center body.

DETAILED DESCRIPTION OF EMBODIMENTS

Figure 1:
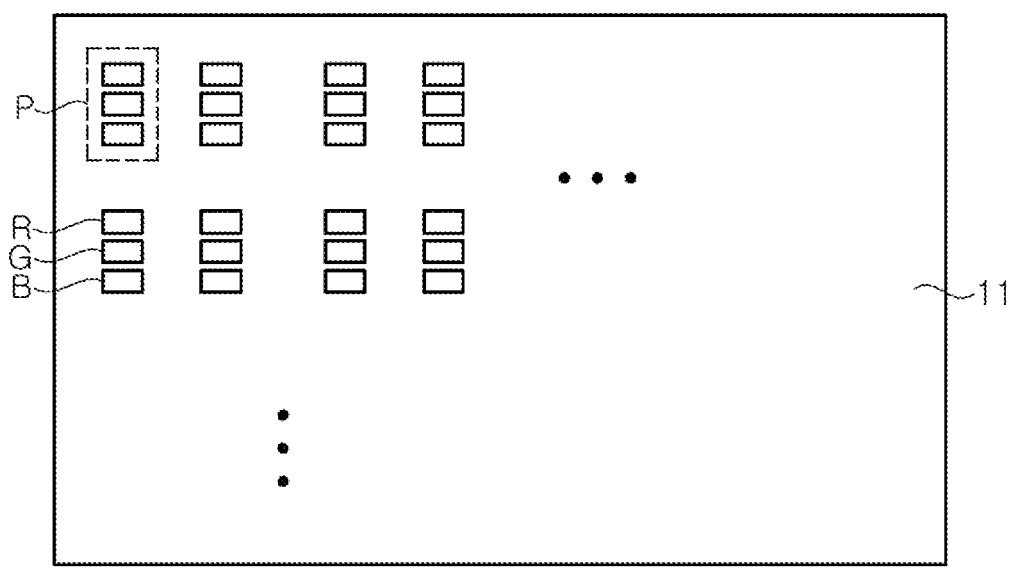
FIG. 1 is a plan view illustrating an LED display apparatus according to the related art.
Figure 2:
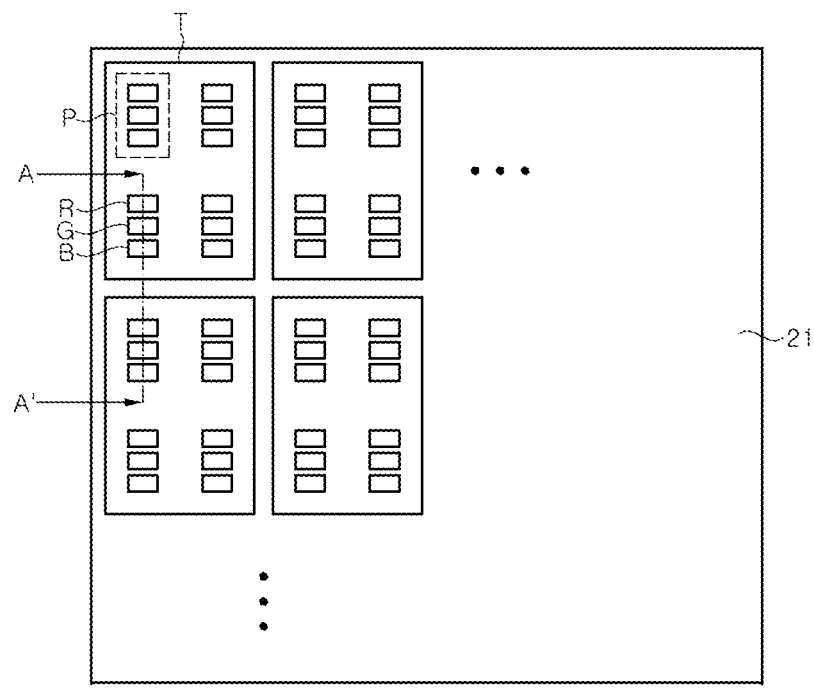
FIG. 2 is a plan view illustrating a display apparatus including micro LED modules according to the related art.
Figure 3:
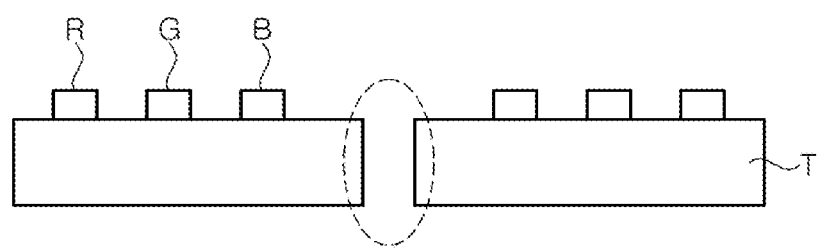
FIG. 3 is a schematic partial cross-sectional view taken along line A-A' of FIG. 2.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

An exemplary embodiment provides a display apparatus including a display substrate, first micro LED modules arranged on the display substrate, and at least one second micro LED module disposed between the first micro LED modules. Each of the first micro LED modules includes a first substrate, and micro LEDs disposed on the first substrate. The second micro LED module includes a second substrate, and micro LEDs disposed on the second substrate. The second substrate bridges two adjacent first substrates.

As the second substrate bridges the first substrates, the second substrate is not separated from the first substrates. As such, linear defects observed on a screen may be reduced. The second substrate may be partially overlapped with each of the two adjacent first substrates.

In some forms, an upper surface of the second substrate may be placed higher than those of the two adjacent first substrates.

In another form, the upper surface of the second substrate may be flush with those of the two adjacent first substrates.

In at least one variant, the display apparatus may further include a molding member covering the first and second micro LED modules.

The first micro LED module may further include a first connector connecting an interconnection on the upper surface of the first substrate and an interconnection on a lower surface thereof.

In another variant, the first connector may connect the interconnection on the upper surface of the first substrate and the interconnection on the lower surface thereof through a via hole of the first substrate.

In yet another variant, the first connector may be formed on a side surface of the first substrate to connect the interconnection on the upper surface of the first substrate and the interconnection on the lower surface thereof.

The second substrate may have a T-shaped cross section including a center body and a top plate spread over the center body, and the top plate of the second substrate may be partially disposed on each of the adjacent first substrates.

The first substrates may include regions recessed at an edge thereof, respectively, and the top plate of the second substrate may be partially disposed on each of the recessed regions of the first substrates.

The second micro LED module may further include a second connector for connecting an interconnection on the upper surface of the second substrate and an interconnection on a lower surface thereof.

In at least one variant, the second connector may be formed in a via hole passing through the top plate of the second substrate and the center body.

In another variant, the second connector may be formed on a side surface of the top plate of the second substrate.

In yet another variant, the second connector may be disposed in a through hole formed in the top plate of the second substrate to connect an interconnection on the top plate and an interconnection on a lower surface of the top plate.

At least one of the micro LEDs may be disposed over a region between the first substrate and the center body.

Meanwhile, the first micro LED modules may include a plurality of pixel regions, respectively, and the second micro LED module may include a plurality of pixel regions.

Each of the pixel regions may emit red light, green light, and blue light.

At least two second micro LED modules may be disposed on the display substrate, the first micro LED modules may have first substrates having identical sizes to one another, and the at least two second micro LED modules may have second substrates having different sizes form each other.

A micro LED module according to one or more exemplary embodiments includes a center body, a top plate located over the center body, and micro LEDs disposed on the top plate. The top plate has a wider width than that of the center body in one direction, and at least one of the micro LEDs is disposed outside of an upper region of the center body.

Further, a plurality of pixels may be disposed on the top plate, and each of the pixels may include at least one micro LED.

Hereinafter, exemplary embodiments will be described in detail with reference to the accompanying drawings.

Figure 4:
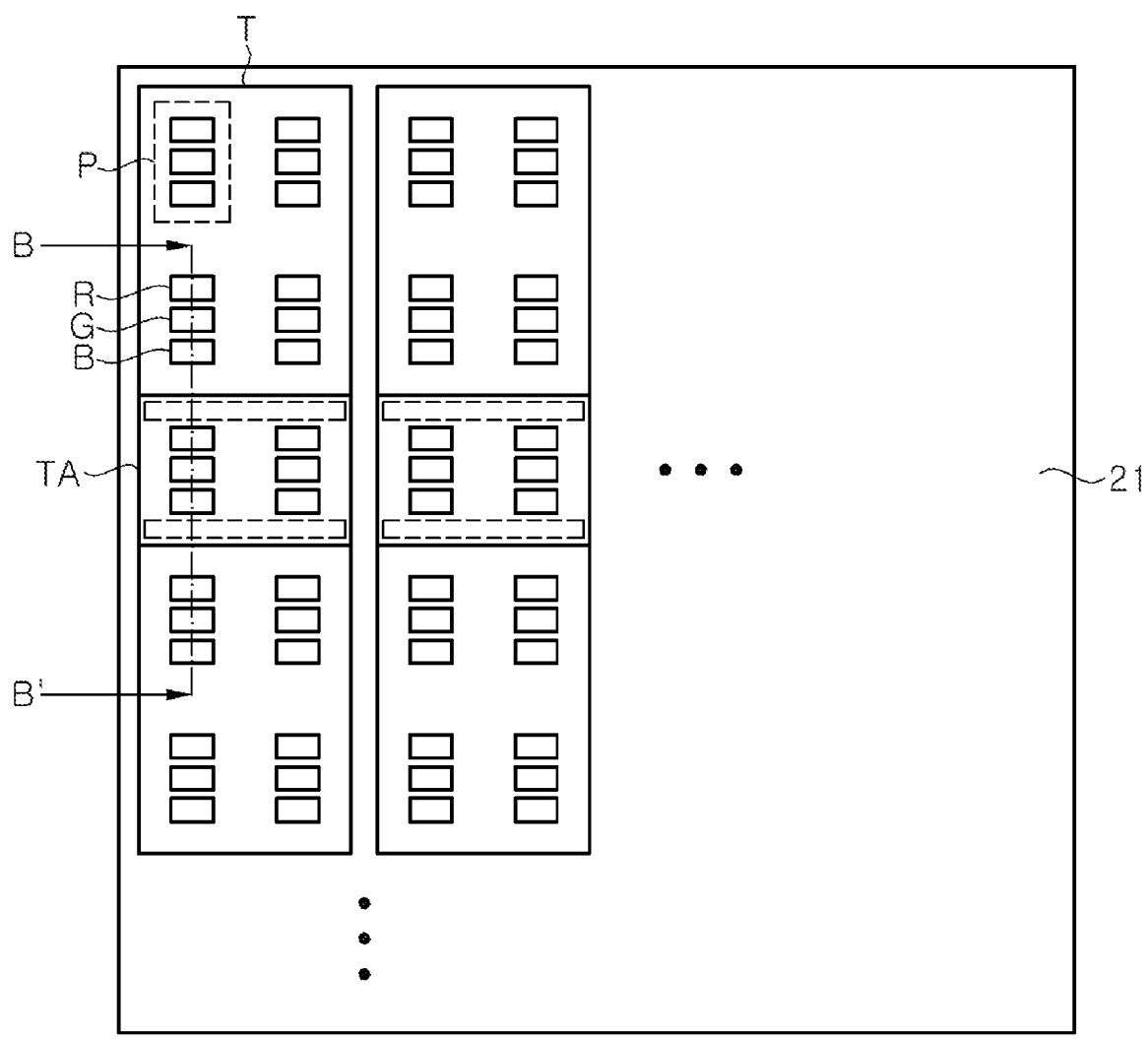
FIG. 4 is a schematic plan view illustrating a display apparatus including micro LED modules according to one or more exemplary embodiments of the present disclosure.
Figure 5:
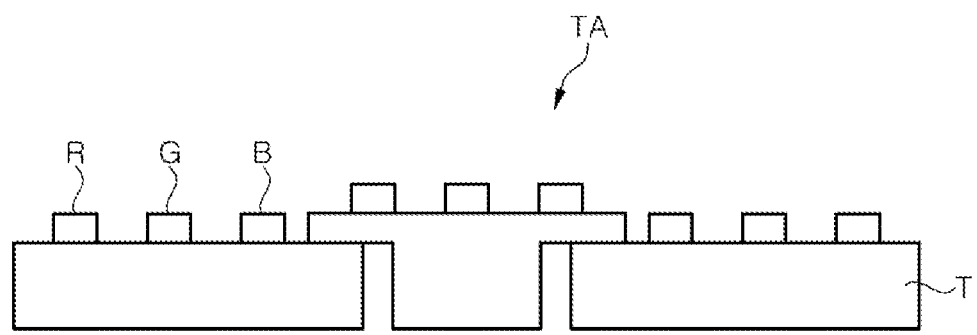
FIG. 5 is a schematic partial cross-sectional view taken along line B-B' of FIG. 4.
Figure 6:
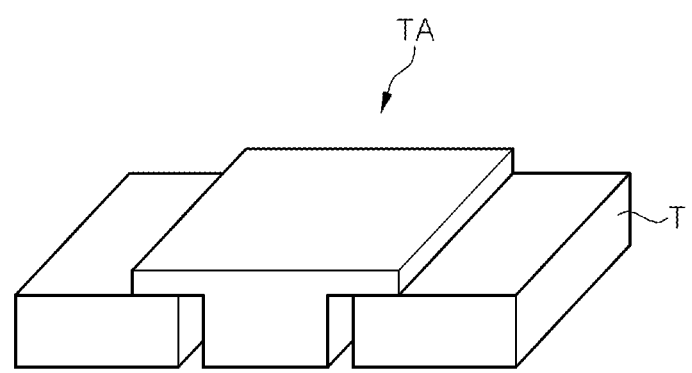
FIG. 6 is a schematic perspective view of FIG. 5.
Figure 7:
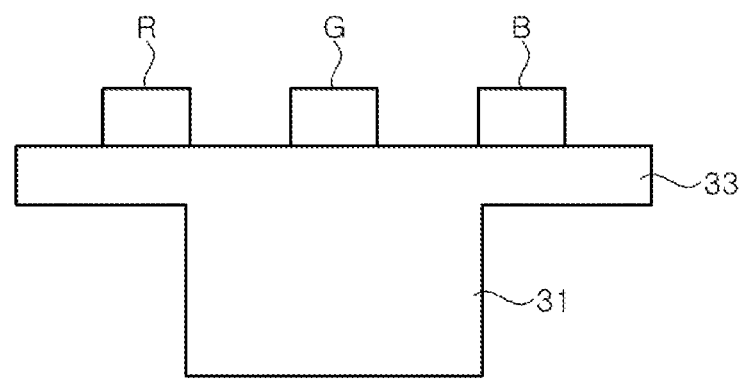
FIG. 7 is a schematic cross-sectional view illustrating a second micro LED module according to one or more exemplary embodiments of the present disclosure.

FIG. 4 is a schematic plan view illustrating a display apparatus including micro LED modules according to an exemplary embodiment, FIG. 5 is a schematic partial cross-sectional view taken along line B-B' of FIG. 4, FIG. 6 is a schematic perspective view of FIG. 5, and FIG. 7 is a schematic cross-sectional view illustrating a second micro LED module TA according to an exemplary embodiment.

Referring to FIGS. 4, 5, and 6, a display apparatus 100 includes a display substrate 21, first micro LED modules T, and a second micro LED module TA. The first and second micro LED modules T and TA may include a plurality of pixels P, and each of the pixels P may include micro LEDs R, G, and B.

The display apparatus 100 may be generally known as a micro LED display apparatus, and a light emitting area of one sub-pixel may be 10,000 $\mu m^2$ or less in some embodiments. More specifically, the light emitting area of one sub-pixel may be, by way of example, 4,000 $\mu m^2$ or less, and in other embodiments, 1,000 $\mu m^2$ or less.

The display substrate 21 is used to support the first and second micro LED modules T and TA, and is not particularly limited as long as it is capable of securing them. In the illustrated exemplary embodiment, the display substrate 21 may be a circuit board including a circuit such as a TFT, but the inventive concepts are not limited thereto, and may be a substrate without a circuit. The display substrate 21 may have a size corresponding to a size of a screen of the display apparatus 100, but the inventive concepts are not limited thereto.

The display substrate 21 may be, for example, glass, quartz, ceramic, Si, SiC, metal, fiber, polymer, or the like, and may be a transparent or opaque substrate. In addition, the display substrate 21 may be a rigid or flexible PCB (printed circuit board).

In an exemplary embodiment, the display substrate 21 may be a transparent substrate such as glass, quartz, transparent ceramic, transparent film, and transparent PCB. The transparent film may be, for example, PEN (Poly Ethylene Naphthalene), PET (Poly Ethylene Terephthalate), PI (Polyimide), PE (Poly Ethylene) film, PMMA (Poly Methyl Methacrylate), or the like.

An interconnection portion on the display substrate 21 may also be formed of a transparent film such as a transparent conductive oxide film or a transparent conductive layer such as carbon nanotubes or carbon graphite, but the inventive concepts are not limited thereto. When the display substrate 21 is a transparent substrate, a background structure or setting of the display apparatus can be observed through the display substrate 21 before the display apparatus is turned on. For example, when the display substrate 21 is attached to a wall, a display screen can be hardly noticeable and a wall surface can be observed through the display screen. As the micro LEDs R, G and B have a very small size, the background can be observed through a region between the micro LEDs R, G and B. Accordingly, a transparent display apparatus, for example, a head-up display may be provided in some embodiments.

Furthermore, when the display substrate 21 is formed of a flexible plastic, a flexible display may be implemented.

In an exemplary embodiment, the transparent display apparatus may use a glass plate such as window glass of a building or automobile glass as the display substrate 21.

In another exemplary embodiment, the transparent display apparatus may be manufactured using a transparent printed circuit board as the display substrate 21, and the transparent display apparatus may be attached to the glass plate such as window glass or automobile glass.

In another exemplary embodiment, a flexible printed circuit board (FPCB) may be used as the display substrate 21 to manufacture a flexible display apparatus, and the flexible display apparatus may be attached to the glass plate such as window glass or automobile glass, or the flexible display apparatus may be used instead of the glass plate.

In a particular exemplary embodiment, the glass plate such as window glass or automobile glass or a transparent display substrate may be manufactured to have electrochromic characteristics, and light transmittance thereof may be adjusted by controlling current and voltage. In addition, transparency of the display substrate 21 may be adjusted by controlling an amount of light emitted from the micro LEDs R, G, and B in each pixel.

The first micro LED modules T are arranged on the display substrate 21. The first micro LED modules T may be attached on the display substrate 21 using a tiling technique. The first micro LED modules T may be arranged to be spaced apart from one another.

The first micro LED module T may include a plurality of pixels P disposed on a first substrate, and the pixel P may include micro LEDs R, G, and B. The first substrate may have substantially flat upper and lower surfaces. The micro LEDs R, G, and B may emit red light, green light, and blue light, respectively. In some embodiments, the micro LED refers to a micro-scale luminous body manufactured using an inorganic semiconductor layer. The micro LED may generally include a first conductivity type semiconductor layer, an active layer, and a second conductivity type semiconductor layer. A structure of the micro LED may vary, such as a vertical type, a lateral type, and a flip chip type, and the inventive concepts are not particularly limited to a specific type. Electrodes, pads, and an insulation layer for electrical connection to the micro LED, which are available in the pertinent art, may be additionally formed.

Each of the micro LEDs R, G, and B may constitute a sub-pixel, and sub-pixels arranged laterally to one another as shown in FIG. 4 may constitute a single pixel P. In another exemplary embodiment, a stacked light emitting device in which micro LEDs R, G, and B are stacked one above another may constitute a pixel. The stacked light emitting device may include micro LEDs emitting red light, green light, and blue light, and these micro LEDs may constitute a sub-pixel, respectively.

The first micro LED modules T are arranged to be spaced apart from one another, but an interval between the first micro LED modules T in at least one direction may be configured to have certain dimensions.

Meanwhile, the second micro LED modules TA are disposed between adjacent first micro LED modules T to bridge them. More particularly, the second micro LED module TA is disposed so that an interval is not formed between the adjacent first micro LED module T and the second micro module TA.

The second micro LED module TA may include a plurality of pixels P disposed on a second substrate, and the pixel P may include micro LEDs R, G, and B. The micro LEDs R, G, and B may have an identical structure and an identical size to one another as other micro LEDs, but the inventive concepts are not limited thereto. The micro LEDs R, G, and B may emit red light, green light, and blue light, respectively. Each of the micro LEDs R, G, and B may constitute a sub-pixel, and sub-pixels arranged laterally to one another may constitute a single pixel P. In another exemplary embodiment, a stacked light emitting device may constitute a single pixel P. The stacked light emitting device may include semiconductor stacks that emit red light, green light, and blue light, respectively, and these semiconductor stacks may constitute sub-pixels, respectively.

The second micro LED module TA may be partially overlapped with each of the two adjacent first micro LED modules T. In particular, the second substrate of the second micro LED module TA may be partially disposed on the first substrates of the adjacent first micro LED modules T, respectively.

The first substrate and the second substrate may be transparent or opaque substrates. In an exemplary embodiment, the first substrate and the second substrate may be a transparent substrate formed of a transparent material to provide a transparent display apparatus. The first substrate and the second substrate may be, for example, the transparent substrate described with respect to the display substrate 21, and repeated detailed descriptions thereof are omitted to avoid redundancy.

As shown in FIGS. 5, 6 and 7, the second substrate may have a center body 31 and a top plate 33. The top plate 33 is located on the center body 31 and has a wider width than that of the center body 31 in at least one direction. Accordingly, the second substrate may have a T-shaped cross-sectional shape. Both edges of the top plate 33 may be disposed on the first substrates of the first micro LED module T. Accordingly, as shown in FIGS. 5 and 6, an upper surface of the second substrate may be placed higher than that of the first substrate.

Meanwhile, at least one of the micro LEDs R, G, B of the second micro LED module TA may be disposed in an upper region between the first substrate of the first micro LED module T and the center body 31 of the second micro LED module TA. As such, it is possible to prevent the region between the first substrate and the center body 31 from being observed as a linear defect on the screen.

In the illustrated exemplary embodiment, although the first micro LED module T is shown to include four pixels P, by way of example, the first micro LED module T may include a larger number of pixels. Further, although the second micro LED module TA is shown to include two pixels P by way of example, the second micro LED module TA may include a larger number of pixels.

According to the illustrated exemplary embodiment, by disposing the second micro LED modules TA between the adjacent first micro LED modules T, it is possible to prevent the linear defect from being observed on the screen.

Figure 8:
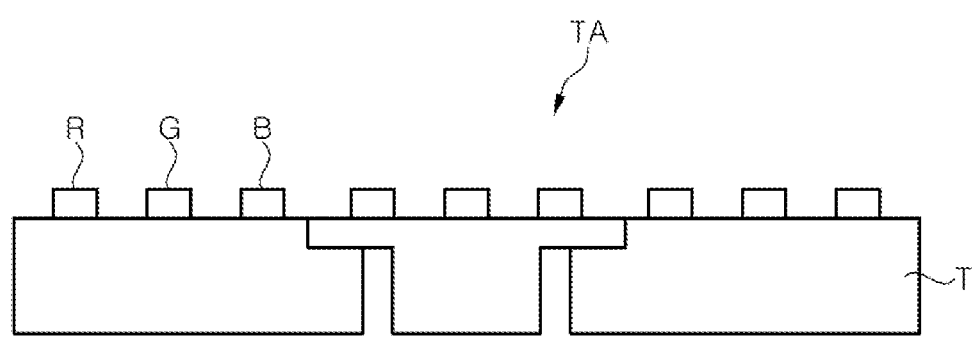
FIG. 8 is a schematic partial cross-sectional view illustrating a display apparatus including micro LED modules according to one or more exemplary embodiments of the present disclosure.

In the illustrated exemplary embodiment, the upper surface of the second substrate is exemplarily illustrated and described as being placed higher than that of the first substrate. In other embodiments, as shown in FIG. 8, the upper surface of the second substrate may be placed at substantially the same elevation as that of the first substrate. For example, a recessed region may be formed at an edge of the first substrate of the first micro LED module T, and the top plate of the second substrate of the second micro LED module TA may be partially disposed on each of the recessed regions of the adjacent first substrates. As such, the micro LEDs R, G, and B on the first micro LED module and the second micro LED module may be placed at substantially the same elevation.

Meanwhile, the first micro LEDs R, G, and B on the first micro LED module T may be electrically connected to pads on the first substrate, and these pads may be electrically connected to a driver(s) for driving the first micro LEDs R, G, and B. The driver may be disposed on the display substrate 21, but the inventive concepts are not limited thereto. In particular, when a plurality of first micro LED modules T is arranged, the drivers for driving each of the first micro LED modules T may be provided on the first substrate. In this case, the driver may be disposed on a rear surface of the first substrate, and the pads thereof may be electrically connected to the driver through electrical interconnection.

Various techniques for electrically connecting the first micro LEDs R, G, and B disposed on the first substrate to the driver disposed on the rear surface of the first substrate may be used, which will be described with reference to FIGS. 9 and 10.

Figure 9:
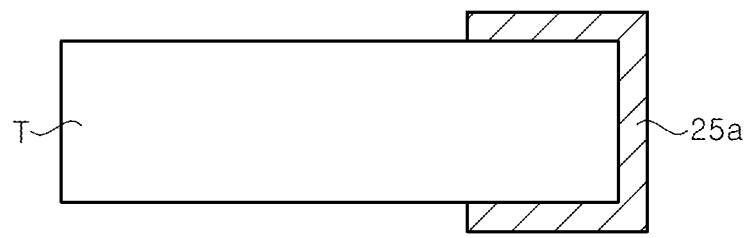
FIG. 9 is a schematic cross-sectional view illustrating a connector of a first micro LED module according to an exemplary embodiment.

FIG. 9 is a schematic cross-sectional view illustrating a connector 25a of the first micro LED module T according to an exemplary embodiment.

Referring to FIG. 9, the connector 25a connecting n an upper surface of a first substrate and a lower surface thereof may be disposed on a side surface of the first substrate. A driver (not shown in the drawing) is disposed on the lower surface of the first substrate. For example, a scan driver for driving a scan line and a data driver for driving a data line may be disposed.

Micro LEDs R, G, and B on the first substrate may be electrically connected to the driver, and may be driven by the driver. In this case, to electrically connect the micro LEDs R, G, and B disposed on the first substrate to the driver (not shown), the upper surface and the lower surface of the first substrate may be connected through the connector 25a. A plurality of interconnections is disposed on the upper and lower surfaces of the first substrate, and thus, a plurality of connectors 25a is provided on the first substrate.

Figure 10:
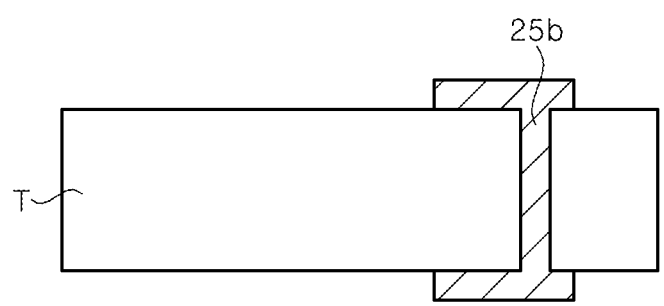
FIG. 10 is a schematic cross-sectional view illustrating a connector of a second micro LED module according to one or more exemplary embodiments of the present disclosure.

FIG. 10 is a schematic cross-sectional view illustrating a connector 25b of the first micro LED module according to an exemplary embodiment.

Referring to FIG. 10, the connector 25b in the illustrated exemplary embodiment is substantially similar to the connector 25a described with reference to FIG. 9, but the connector 25b is formed in a through-hole passing through a first substrate. In some embodiments, the connector 25b may be formed near an edge of the first substrate.

Figure 11:
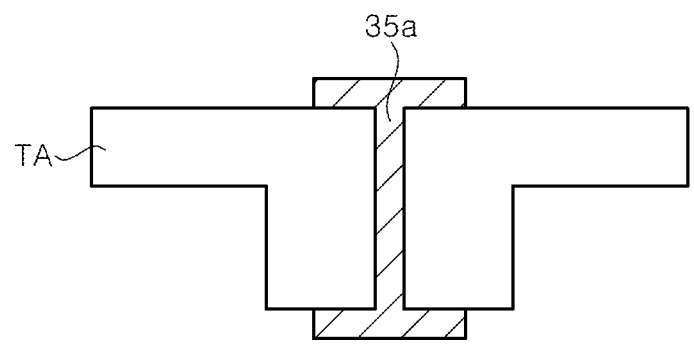
FIG. 11 is a schematic cross-sectional view illustrating a connector of a third micro LED module according to one or more exemplary embodiments of the present disclosure.
Figure 12:
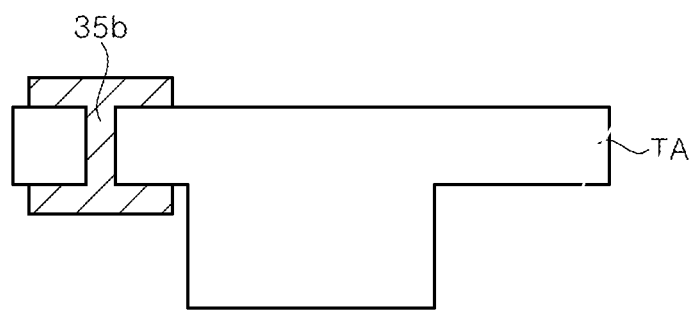
FIG. 12 is a schematic cross-sectional view illustrating a connector of a fourth micro LED module according to one or more exemplary embodiments of the present disclosure.
Figure 13:
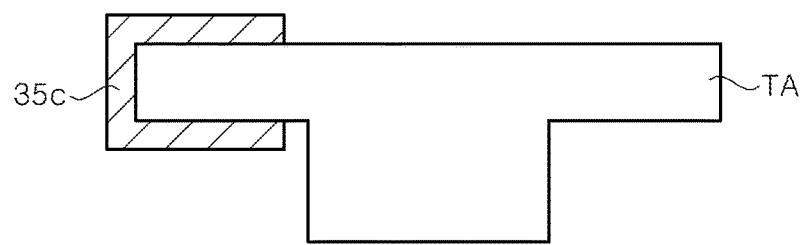
FIG. 13 is a schematic cross-sectional view illustrating a connector of a fifth micro LED module according to one or more exemplary embodiments of the present disclosure.

Meanwhile, a second micro LED module TA may include micro LEDs R, G, and B disposed on a second substrate, and interconnections are needed to electrically connect the micro LEDs R, G, and B and a driver to drive the micro LEDs R, G, and B. FIGS. 11 through 13 are schematic cross-sectional views illustrating various connectors 35a, 35b, and 35c for providing interconnections.

As shown in FIG. 11, the connector 35a may be formed in a through-hole passing through a center body. In this case, a driver (not shown) may be disposed on a lower side of the center body, or may be disposed on a display substrate 21.

As shown in FIG. 12, the connector 35b may be formed in a through-hole passing through a top plate. Alternatively, as shown in FIG. 13, the connector 35c may be formed on a side surface of the top plate.

Figure 14:
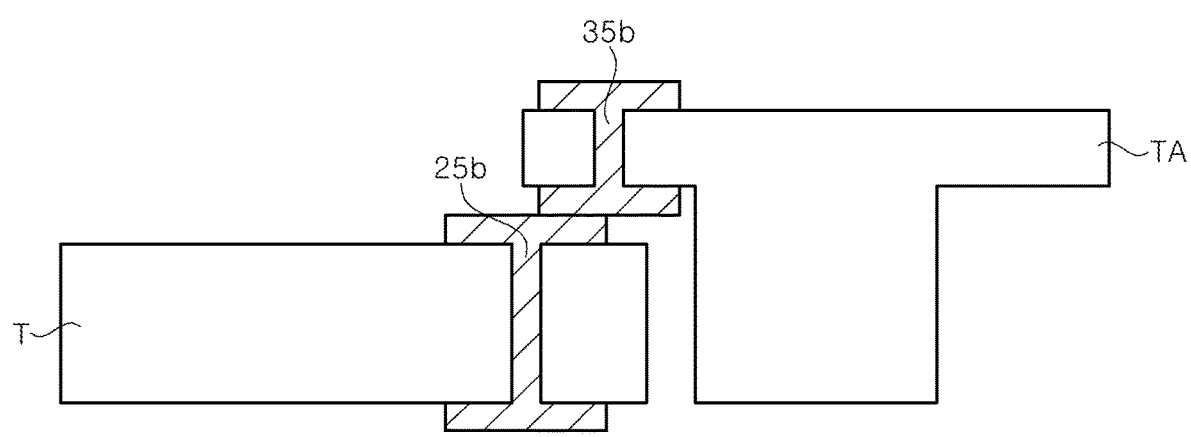
FIG. 14 is a schematic cross-sectional view illustrating electrical connection between a first micro LED module and a second micro LED module according to one or more exemplary embodiments of the present disclosure.

FIG. 14 is a schematic cross-sectional view illustrating electrical connection between a first micro LED module T and a second micro LED module TA according to an exemplary embodiment.

Referring to FIG. 14, the second micro LED module TA may be partially overlapped with the first micro LED module T, and interconnections may electrically contact the second micro LED module T at an overlapped portion. As such, the first micro LED module T and the second micro LED module TA may be electrically connected.

As shown in FIG. 14, by electrically connecting the first micro LED module T and the second micro LED module TA, micro LEDs R, G, and B of the second micro LED module TA may be driven by, for example, using a driver disposed on the first micro LED module T.

Figure 15:
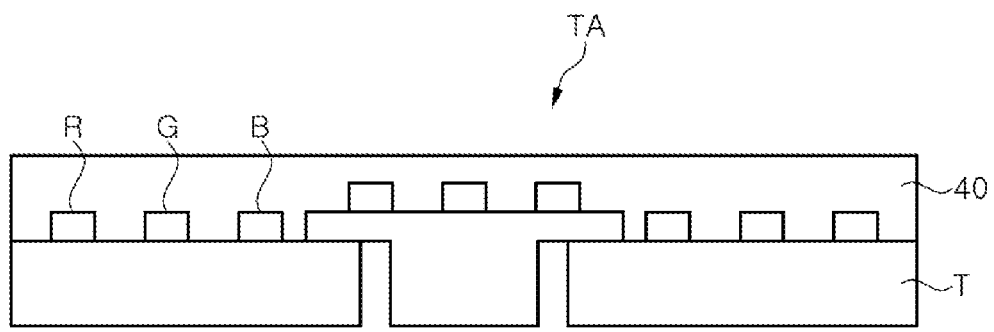
FIG. 15 is a schematic partial cross-sectional view illustrating a display apparatus according to one or more exemplary embodiments of the present disclosure.

FIG. 15 is a schematic partial cross-sectional view illustrating a display apparatus according to one or more exemplary embodiments of the present disclosure.

Referring to FIG. 15, the display apparatus according to the exemplary embodiment is substantially similar to the display apparatus 100 described with reference to FIGS. 4 through 7 above, but the display apparatus further includes a molding member 40.

The molding member 40 covers micro LEDs R, G, and B on first micro LED modules T and a second micro LED module TA. The molding member 40 may cover all of the micro LED modules T and TA on a display substrate 21. The molding member 40 may be formed of a transparent resin or may be a black molding having a light absorbing function. Black molding increases a contrast ratio and improves the quality of a final product.

Figure 16:
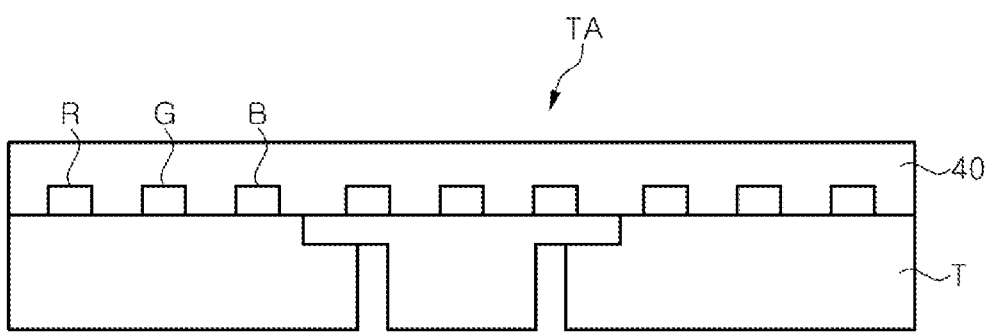
FIG. 16 is a schematic partial cross-sectional view illustrating a display apparatus according to one or more exemplary embodiments of the present disclosure.

FIG. 16 is a schematic partial cross-sectional view illustrating a display apparatus according to an exemplary embodiment.

Referring to FIG. 16, the display apparatus according to the exemplary embodiment is substantially similar to the display apparatus described with reference to FIG. 8, but the display apparatus in the exemplary embodiment further includes a molding member 40. The molding member 40 described with reference to FIG. 15 are relevant here.

Figure 17:
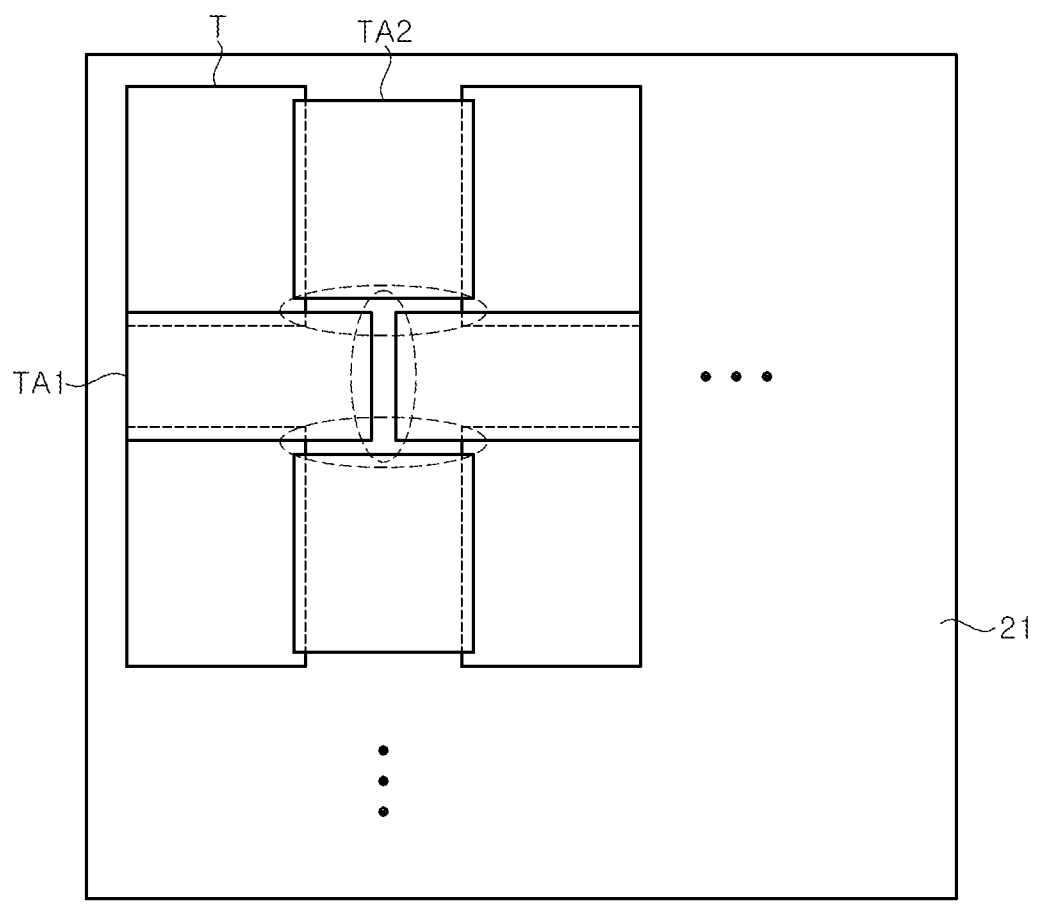
FIG. 17 is a schematic plan view illustrating a display apparatus according to one or more exemplary embodiments of the present disclosure.

FIG. 17 is a schematic plan view illustrating a display apparatus 200 according to one or more exemplary embodiments of the present disclosure.

Referring to FIG. 17, the display apparatus 200 according to the exemplary embodiment is substantially similar to the display apparatus 100 described with reference to FIGS. 4 through 7, but second micro LED modules TA1 and TA2 are arranged in a column direction and a row direction of first micro LED modules T.

The second micro LED module TA1 is disposed between adjacent first micro LED modules T in the column direction of the first micro LED modules T, and the second micro LED module TA2 is disposed between the adjacent first micro LED modules T in the row direction of the first micro LED modules T.

In FIG. 17, dashed ellipses represent portions that can be observed as potential linear defects. These portions are significantly reduced compared to a case where the second micro LED modules TA1 and TA2 are not employed, and thus, the linear defect observed on a screen may be drastically reduced by disposing the second micro LED modules TA1 and TA2.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

The invention claimed is:

1. An LED display apparatus, comprising:
a display substrate;
first micro LED modules arranged on the display substrate; and
at least one second micro LED module disposed between and spaced from at least two of the first micro LED modules on the display substrate, wherein:
each of the first micro LED modules includes a first substrate, and a first set of micro LEDs disposed on the first substrate,
each of the at least one second micro LED module includes a second substrate, and a second set of micro LEDs disposed on the second substrate, and
a portion of the second substrate of one of the at least one second micro LED module bridges at least two adjacent first substrates of the at least two of the first micro LED modules such that each space between each of the at least two adjacent first substrates and the second substrate on the display substrate is not visible in a plan view of the LED display apparatus.

2. The display apparatus of claim 1, wherein the second substrate is partially overlapped with each of the two adjacent first substrates.

3. The display apparatus of claim 2, wherein an upper surface of the second substrate is placed higher than upper surfaces of the two adjacent first substrates.

4. The display apparatus of claim 2, wherein an upper surface of the second substrate is flush with upper surfaces of the two adjacent first substrates.

5. The display apparatus of claim 1, further comprising: a molding member covering the first and second micro LED modules.

6. The display apparatus of claim 1, further comprising: a first connector connecting an upper surface of the first substrate of at least one of the first micro LED modules and a lower surface thereof.

7. The display apparatus of claim 6, wherein the first connector connects the upper surface of the first substrate and the lower surface thereof through a via hole of the first substrate.

8. The display apparatus of claim 6, wherein the first connector is formed on a side surface of the first substrate to connect the upper surface of the first substrate and the lower surface thereof.

9. An LED display apparatus, comprising:
a display substrate;
first micro LED modules arranged on the display substrate; and
at least one second micro LED module disposed between the first micro LED modules, wherein:
each of the first micro LED modules includes a first substrate, and a first set of micro LEDs disposed on the first substrate,
the second micro LED module includes a second substrate, and a second set of micro LEDs disposed on the second substrate,
the second substrate bridges two adjacent first substrates, the second substrate has a T-shaped cross section including a center body and a top plate located on the center body, and the top plate of the second substrate is partially disposed on each of the adjacent first substrates.

10. The display apparatus of claim 9, wherein:
at least one of the adjacent first substrates includes a region recessed at an edge thereof, and
the top plate of the second substrate is partially disposed on the recessed region of the at least one of the adjacent first substrates.

11. The display apparatus of claim 9, wherein the second micro LED module further includes a second connector for connecting an upper surface of the second substrate and a lower surface thereof.

12. The display apparatus of claim 11, wherein the second connector is formed in a via hole passing through the top plate of the second substrate and the center body.

13. The display apparatus of claim 11, wherein the second connector is formed on a side surface of the top plate of the second substrate.

14. The display apparatus of claim 11, wherein the second connector is disposed in a through hole formed in the top plate of the second substrate to connect an upper surface of the top plate and a lower surface of the top plate.

15. The display apparatus of claim 9, wherein at least one of the micro LEDs is disposed over a region between the first substrate and the center body.

16. The display apparatus of claim 1, wherein:
the first micro LED modules includes a plurality of pixel regions, respectively, and
the second micro LED module includes a plurality of pixel regions.

17. The display apparatus of claim 16, wherein each of the pixel regions emits red light, green light, and blue light.

18. The display apparatus of claim 1, wherein:
at least two second micro LED modules are disposed on the display substrate,
the first micro LED modules include first substrates having identical sizes to one another, and
the at least two second micro LED modules include second substrates having different sizes from each other.

19. An LED display apparatus, comprising:
a display substrate;
first micro LED modules arranged on the display substrate; and
at least one second micro LED module disposed between the first micro LED modules, wherein:
each of the first micro LED modules includes a first substrate, and a first set of micro LEDs disposed on the first substrate,
the second micro LED module includes a second substrate, and a second set of micro LEDs disposed on the second substrate,
the second substrate bridges two adjacent first substrates,
the second micro LED module, comprising:
a center body;
a top plate located over the center body; and
micro LEDs disposed on the top plate, wherein:
the top plate has a wider width than that of the center body in one direction, and
at least one of the micro LEDs is disposed outside of an upper region of the center body.

20. The display apparatus of claim 19, wherein:
a plurality of pixels is disposed on the top plate, and
each of the pixels includes at least one micro LED.

* * * * *